United States Patent [19]

Jolly

[11] 4,253,887
[45] Mar. 3, 1981

[54] METHOD OF DEPOSITING LAYERS OF SEMI-INSULATING GALLIUM ARSENIDE

[75] Inventor: Stuart T. Jolly, Yardley, Pa.

[73] Assignee: RCA Corporation, New York, N.Y.

[21] Appl. No.: 70,023

[22] Filed: Aug. 27, 1979

[51] Int. Cl.³ .................. H01L 21/205; H01L 21/322
[52] U.S. Cl. ...................................... 148/175; 29/571;
 148/174; 156/605; 156/612; 252/62.3 GA;
 357/58; 357/63; 357/64
[58] Field of Search ............................. 148/174, 175;
 252/62.3 GA; 29/571; 357/15, 22, 23, 58, 63,
 64; 156/605, 612

[56] References Cited

U.S. PATENT DOCUMENTS

| 407,651 | 2/1978 | James | 357/22 |
|---|---|---|---|
| 3,461,004 | 8/1969 | Lochner et al. | 148/175 |
| 3,533,967 | 10/1970 | McNeely et al. | 252/62.3 GA |
| 3,657,615 | 4/1972 | Driver | 357/15 |
| 3,716,405 | 2/1973 | Lim | 148/174 X |
| 3,758,348 | 9/1973 | Whigham et al. | 148/175 |
| 3,836,408 | 9/1974 | Kasano | 148/175 |
| 3,994,755 | 11/1976 | Kamath et al. | 148/172 |
| 4,004,953 | 1/1977 | Otsubo et al. | 148/172 |

OTHER PUBLICATIONS

Tietjen et al., "Vapor-Phase Growth . . . .III-V . . . Semiconductor", Solid State Tech., Oct. 1972, pp. 42–49.
Lawley, K. L., "Vapor Growth . . . Ga Ae . . . Hydrogen-Water Vapor Process", J. Electrochem. Soc., vol. 113, No. 3, Mar. 1966, pp. 240–245.
Tietjen et al., "An All-in-One Process for Building Junctions", Electronics, Nov. 13, 1967, pp. 113–115.
Palm et al., "Effect of Oxygen Injection . . . VPE . . . Ga Aa Films", J. Electronic Mat'ls., vol. 8, No. 5, 1979, pp. 555–570.
Weiner, M., "Si Contamination . . . . Growth of Ga Ar & Ga P", J. Electrochem. Soc., vol. 119, No. 4, Apr. 1972, pp. 496–504.
Tietjen et al., "Prep. & Properties of . . Ga Aa P . . . . Arsine . . . ", Ibid., vol. 113, No. 7, Jul. 1966, pp. 724–728.
Gottlieb et al., "Epitaxial Growth of Ga Aa Using Water Vapor", R.C.A. Review, Dec. 1963, pp. 585–595.

*Primary Examiner*—R. Dean
*Assistant Examiner*—W. G. Saba
*Attorney, Agent, or Firm*—Birgit E. Morris; Donald S. Cohen

[57] ABSTRACT

A method of depositing a layer of semi-insulating gallium arsenide on a substrate by vapor phase epitaxy. The layer is deposited by thermally decomposing a gaseous mixture of arsine, gallium chloride and a small amount of water vapor to deposit a layer of gallium arsenide doped with oxygen.

10 Claims, 1 Drawing Figure

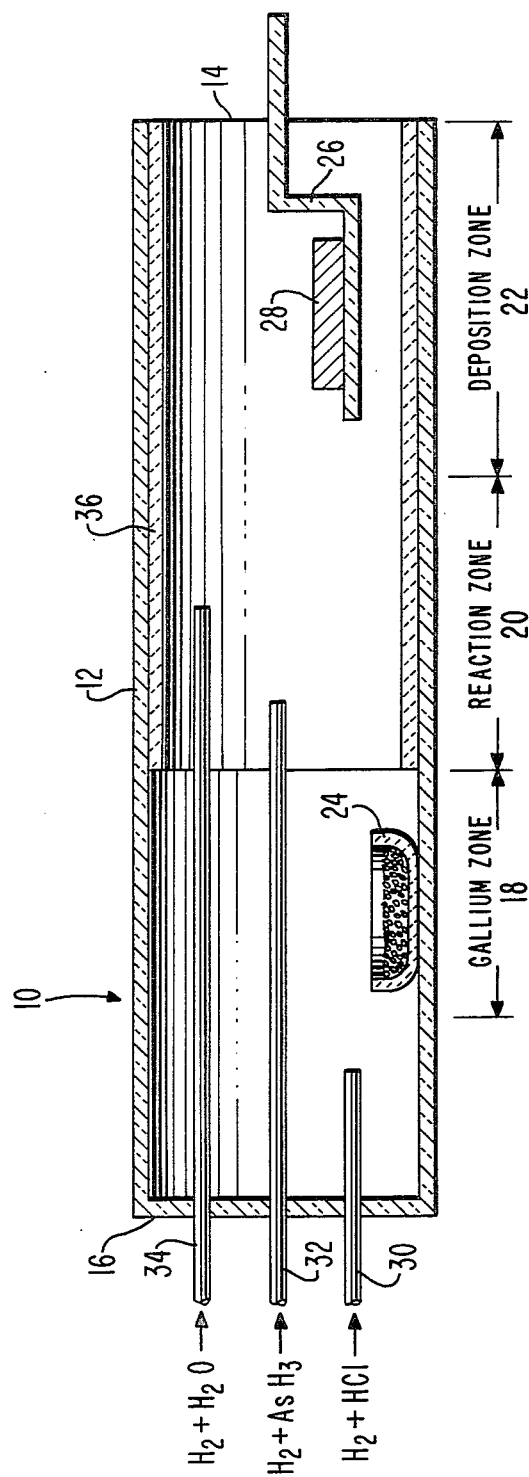

METHOD OF DEPOSITING LAYERS OF SEMI-INSULATING GALLIUM ARSENIDE

BACKGROUND OF THE INVENTION

The present invention relates to a method of depositing layers of semi-insulating gallium arsenide, and particularly to a vapor phase epitaxy process of depositing oxygen doped gallium arsenide on a substrate.

Gallium arsenide has found considerable use in making certain types of electrical components, such as field effect transistors, transferred electron effect devices and the like. Certain types of these electrical components are formed in a layer of gallium arsenide of a desired conductivity type, generally N type, on an insulating substrate. The layer of gallium arsenide is generally epitaxially deposited on the insulating substrate. To obtain gallium arsenide layers of good crystalline quality, it is desirable to use a substrate which will nucleate the epitaxial growth of good crystalline quality material. Semi-insulating, i.e. high conductivity, gallium arsenide of good crystalline quality is most desirable for this purpose. However, high quality, semi-insulating gallium arsenide substrates are expensive. Therefore, it would be desirable to form a layer of high quality semi-insulating gallium arsenide on a substrate, which substrate could be of a poor quality and therefore less expensive. The semiconductor material for forming the semiconductor device can then be formed on the semi-insulating layer. Also, it would be desirable to be able to form the semi-insulating layer by the same basic technique as is used to form the semiconductor device material. This would permit the two materials to be formed in a sequence so as to reduce the cost of making the semiconductor device.

SUMMARY OF THE INVENTION

A method of depositing an epitaxial layer of semi-insulating gallium arsenide includes bringing a substrate into contact with a gaseous mixture containing gallium, arsenic and water vapor. The gaseous mixture is thermally decomposed which causes gallium arsenide and oxygen to deposit on the substrate and form an epitaxial layer of oxygen doped gallium arsenide.

BRIEF DESCRIPTION OF THE DRAWING

The FIGURE of the drawing is a schematic view of an apparatus suitable for carrying out the method of the present invention.

DETAILED DESCRIPTION

The method of the present invention for depositing semi-insulating gallium arsenide utilizes the basic technique of vapor phase epitaxy in an open tube flow method which is described in the article of J. J. Tietjen et al entitled, "VAPOR PHASE GROWTH OF SEVERAL III-V COMPOUND SEMICONDUCTORS", *Solid State Technology*, Vol. 15, No. 10, pp. 42-49, October 1972. In this method a gaseous mixture containing gallium and arsenic is passed through a tube and over a substrate onto which the gallium arsenide layer is to be deposited. The gaseous mixture is heated to a temperature at which the gases decompose to provide gallium and arsenic which combine and deposit on the substrate as gallium arsenide.

The substrate is of a material, such as single crystalline gallium arsenide, which nucleates the epitaxial growth of single crystalline gallium arsenide. The gallium-containing portion of the gaseous mixture can be gallium chloride, which is obtained by passing hydrogen chloride (HCl) over gallium using hydrogen as the carrier gas. The arsenic-containing portion of the gaseous mixture can be arsine ($AsH_3$) which is also carried through the tube by hydrogen.

To obtain the deposition of semi-insulating gallium arsenide in accordance with the present invention, a small amount of water vapor is included in the gaseous mixture. The water vapor is also carried into the tube by hydrogen. The gaseous mixture is heated to a temperature at which the compounds in the mixture decompose suitably between about 800° C. and 875° C. As previously stated, the gallium and the arsenic, from the gallium chloride and arsine respectively, combine to form gallium arsenide. The water vapor decomposes to provide oxygen, which becomes incorporated into the gallium arsenide. Thus, the deposited gallium arsenide layer is oxygen doped so as to be semi-insulating. The chemical reaction which occurs in this method to form the gallium arsenide is described in the above-referred to article of J. J. Tietjen et al. The amount of water vapor which should be included in the gas mixture is in the range of 10 to 1000 ppm.

Referring to the drawing, a form of an apparatus for carrying out the method of the present invention is generally designated as 10. The apparatus 10 comprises a reaction tube 12 of a material which will withstand high temperatures, such as quartz. The reaction tube 12 has an open end 14 and a closed end 16. The reaction tube 12 includes a gallium zone 18 adjacent the closed end 16, a reaction zone 20 adjacent the gallium zone 18 and a deposition zone 22 between the reaction zone 20 and the open end 14. In the reaction zone 18 is a container 24 which contains gallium. In the deposition zone 22 is a support 26 which holds the substrate 28 on which the layer of insulating gallium arsenide is to be deposited.

A first inlet tube 30 extends through the closed end 16 of the reaction tube 12 and ends just short of the gallium zone 18. The first inlet tube 30 serves to admit a flow of hydrogen chloride and hydrogen into the reaction zone 12 adjacent the gallium container 24. A second inlet tube 32 extends through the closed end 16 of the reaction tube 12 and ends in the reaction zone 20. The second inlet tube 32 is adapted to admit a flow of arsine and hydrogen into the reaction zone 20. A third inlet tube 34 extends through the closed end 16 of the reaction tube 12 and ends in the reaction zone 20 beyond the end of the second inlet tube 32. The third inlet tube 34 serves to admit the flow of water vapor and hydrogen into the reaction zone 20. A tubular chemically inert liner 36, such as of pyrolytic boron nitride, may be provided over the inner surface of the quartz reaction tube 12 along the reaction zone 20 and deposition zone 22 to prevent contamination by materials from the tube 12. Separate heating means, not shown, extend around each of the zones 18, 20 and 22 of the reaction tube 12 whereby each zone can be heated to its appropriate temperature.

In the use of the apparatus 10 to deposit a layer of semi-insulating gallium arsenide on the substrate 28, a flow of hydrogen chloride and hydrogen is introduced into the reaction tube 12 through the first inlet tube 30. The hydrogen chloride passes over the gallium container 24 where it reacts with the gallium to form gallium chloride. The gallium zone 18 is heated to the appropriate temperature, between 800° C. and 1000° C., to achieve this reaction. The gallium chloride then passes into the reaction zone 20 where it mixes with the arsine and hydrogen being admitted through the second inlet tube 32 and the water vapor and hydrogen being admitted through the third inlet tube 34. The water vapor is preferably obtained by passing a controlled rate of flow of hydrogen over water, which is preferably at a temperature below 0° C. The particular temperature of the water and the rate of gas flow will determine the amount of water vapor incorporated in the hydrogen as it passes therethrough. The reaction zone is heated to a temperature of about 800° C. to 875° C. The mixture of gases then pass into the deposition zone 22 which is at a temperature of about 650° C. to 750° C., where they are cooled to the temperature at which deposition of gallium arsenide along with oxygen on the surface of the substrate 28 will occur. The remaining gases exhaust from the reaction tube through the open end 14.

EXAMPLE

A semi-insulating gallium arsenide layer was epitaxially deposited on a gallium arsenide substrate using the apparatus 10 shown in the drawing by placing the substrate in the deposition zone 22 which was heated to a temperature of about 710° C. Hydrogen chloride was carried by hydrogen carrier gas into the gallium zone 18 through the first inlet tube 30 at the rate of 5 cc/min of hydrogen chloride and 800 cc/min of hydrogen. The gallium zone 18 was at a temperature of about 840° C. The hydrogen chloride reacted with gallium in the container 24 to form gallium chloride which passed into the reaction zone 20 which was heated to a temperature of about 850° C. Simultaneously arsine was carried by a flow of hydrogen through the second inlet tube 32 into the reaction zone 20 at the rate of 130 cc/min of 7% by volume of arsine mixed with hydrogen and 1000 cc/min of the hydrogen carrier gas. Water vapor was carried by hydrogen carrier gas through the third inlet tube 34 into the reaction zone 20 at the rate of 1000 cc/min of the hydrogen carrier gas carrying 130 ppm of water vapor. This was obtained by passing the hydrogen carrier gas over water which was at a temperature of −40° C. The mixture of hydrogen chloride, arsine and water vapor was decomposed to form gallium arsenide and oxygen which deposited on the surface of the gallium arsenide wafer. The deposition was carried out for 30 minutes and provided an oxygen-doped gallium arsenide layer 8 microns in thickness. The resistance of this layer was tested by measuring the leakage across two tungsten probes placed ½ inch apart on the layer and providing a 150 volt across the probes. The layer was found to have a resistance of 75 megohms.

Thus, it can be seen that the method of the present invention provides an epitaxial layer of oxygen-doped gallium arsenide which has a high resistance and is therefore semi-insulating.

This method is compatible with a vapor deposition method for depositing a layer of gallium arsenide for forming a semiconductor device therein. To deposit the semiconductor device layer on the semi-insulating layer it is only necessary to discontinue the flow of water vapor and replace it with a gas containing a conductivity modifier which will provide the semiconductor device layer with the desired conductivity type. Thus, in a single operation the insulating gallium arsenide layer can be deposited first, followed immediately by the semiconductor device layer.

I claim:

1. A method of depositing an epitaxial layer of semi-insulating gallium arsenide on a substrate comprising the steps of:
    (a) bringing the substrate into contact with a gaseous mixture containing gallium, arsenic and oxygen and
    (b) thermally activating said material to cause the formation of gallium arsenide and oxygen which deposits on said substrate as an epitaxial layer of oxygen-doped gallium arsenide.

2. The method in accordance with claim 1 in which the gaseous mixture includes gallium chloride, arsine and water vapor.

3. The method in accordance with claim 2 in which the water vapor is present in the amount of about 10 to 1000 ppm.

4. The method in accordance with claim 3 in which the method is carried out in a tube having an open end, the substrate is in the tube in a deposition zone adjacent the open end and the gases of the mixture are mixed together in a reaction zone adjacent the deposition zone and away from the open end.

5. The method in accordance with claim 4 in which the water vapor and arsine are admitted into the tube directly in the reaction zone.

6. The method in accordance with claim 5 in which the gallium chloride is formed in the tube in a zone adjacent the reaction zone but away from the deposition zone.

7. The method in accordance with claim 6 in which the gallium chloride is formed by passing hydrogen chloride over gallium.

8. The method in accordance with claim 7 in which each of the water vapor, arsine and gallium chloride is carried into the reaction zone by a flow of hydrogen carrier gas.

9. The method in accordance with claim 8 in which the water vapor is obtained by passing the hydrogen carrier gas over water at a temperature of below about 0° C.

10. The method in accordance with claim 7 in which the deposition zone is at a temperature of about 650° C. to 750° C., the reaction zone is at a temperature of about 800° C. to 875° C. and the zone where the gallium chloride is formed is at a temperature of about 800° C. to 1000° C.

* * * * *